US 6,580,106 B2

(12) United States Patent
Hynecek (10) Patent No.: US 6,580,106 B2
(45) Date of Patent: Jun. 17, 2003

(54) CMOS IMAGE SENSOR WITH COMPLETE PIXEL RESET WITHOUT KTC NOISE GENERATION (75) Inventor: Jaroslav Hynecek, Allen, TX (US)

(73) Assignee: Isetex. Inc, Allen, TX (US)

( * ) Notice: Subject to any disclaimer, the term of this patent is extended or adjusted under 35 U.S.C. 154(b) by 0 days.

(21) Appl. No.: 10/043,419

(22) Filed: Jan. 10, 2002

(65) Prior Publication Data

US 2002/0100915 A1 Aug. 1, 2002

Related U.S. Application Data (60) Provisional application No. 60/260,978, filed on Jan. 12, 2001.

(51) Int. Cl.$^7$ .................................. H01L 27/148
(52) U.S. Cl. ............ 257/223; 257/229; 257/230; 257/234; 257/236; 257/238; 257/242
(58) Field of Search ................. 257/362, 222, 257/223, 229, 290, 230, 249, 234, 497, 236, 258, 498, 291, 361, 29.063, 238, 292; 348/294, 302, 308

(56) References Cited

U.S. PATENT DOCUMENTS

| 5,546,438 | A | | 8/1996 | Hynecek | 377/60 |
|---|---|---|---|---|---|
| 5,942,774 | A | * | 8/1999 | Isogai et al. | 257/292 |
| 6,023,081 | A | | 2/2000 | Drowley | 257/292 |
| 6,040,592 | A | | 3/2000 | McDaniel | 257/292 |
| 6,133,862 | A | | 10/2000 | Dhuse | 341/118 |
| 2002/0093034 | A1 | * | 7/2002 | Hynecek | 257/204 |
| 2002/0163042 | A1 | * | 11/2002 | Yamazaki et al. | 257/347 |

* cited by examiner

Primary Examiner—Nathan J. Flynn
Assistant Examiner—Tan Tran
(74) Attorney, Agent, or Firm—John E. Vandigriff (57) ABSTRACT In an image sensing array, the structure of the image sensor pixel is based on a vertical punch through transistor with a junction gate surrounding its source and connected to it, the junction gate being further surrounded by an MOS gate. The new pixel has a large conversion gain, high dynamic range, blooming protection, and low dark current. It senses charge nondestructively with a complete charge removal, which avoids generation of kTC noise. The pixel fabrication is compatible with CMOS processing that includes two metal layers. The array also includes the pixel reset through column sense lines, polysilicon field plate in the image-sensing area for improved pixel isolation, denser pixel packing, and either n-channel or p-channel addressing transistor.

16 Claims, 6 Drawing Sheets

CMOS IMAGE SENSOR WITH COMPLETE PIXEL RESET WITHOUT KTC NOISE GENERATION

PRIORITY

Priority is claimed from Provisional Application Ser. No. 60/260,978, filed Jan. 12, 2001.

FIELD OF THE INVENTION

The invention relates to solid-state image sensors, specifically to Active Pixel CMOS Image Sensors (APS) employing pixels that can be readout repeatedly and do not generate kTC noise.

BACKGROUND OF THE INVENTION

Figure 1:
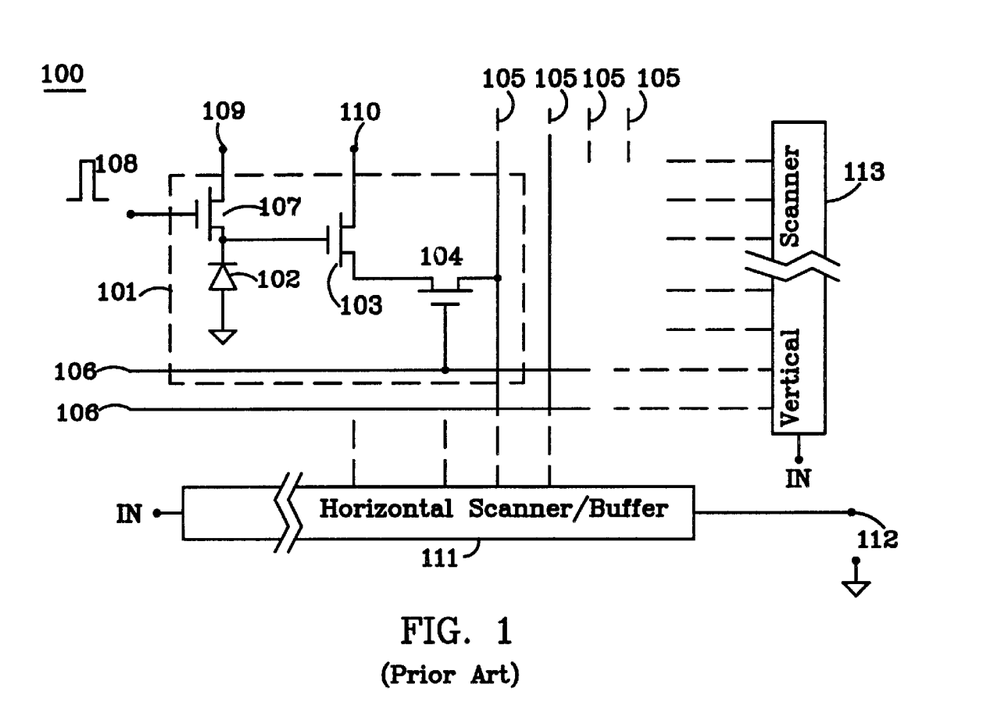
FIG. 1 is the schematic circuit diagram of a typical prior art CMOS sensor pixel that is incorporated into an array whose scanning and addressing circuits are shown only in a block diagram form.

A typical image sensor senses light by converting impinging photons into electrons that are integrated (collected) in sensor pixels. After the integration cycle is completed, charge is converted into a voltage that is supplied to the output terminals of the sensor. An example of the pixel circuit diagram 101 for a typical active pixel CMOS image sensor array 100 is shown in FIG. 1. In this example, the charge to voltage conversion is accomplished by directly integrating charge on the pixel capacitor represented here by the reverse biased diode 102. Charge can be also integrated elsewhere in the pixel, for example in a pinned photodiode (U.S. Pat. No. 6,023,081 to Drowley), and transferred on the pixel capacitor later at a suitable time. The charge conversion capacitor is typically connected to the gate of MOS transistor 103 whose source is further connected through the addressing transistor 104 to the array column sense line 105. The column sense line is shared with other pixels of the same column. The change of source voltage of transistor 103, induced by collected charge, is thus transferred to the column sense line 105, and further through the horizontal scanner and buffer circuits 111 of the array to sensor output terminals 112. Applying pulses to the gates of transistors 104 through horizontal address lines 106 addresses the pixels of the array. The vertical scanner 113 generates the suitable pulses. After charge has been transferred on the capacitor 102, and read out, it has to be removed. This is accomplished by momentarily turning on the reset transistor 107 by applying reset pulse 108 to its gate. Reset transistor drain 107 is connected to the reference bias 109. In some cases, the reference bias is identical with the transistor 103 drain bias 110. A typical prior art CMOS image sensor is described, for example, in U.S. Pat. No. 6,040,592 to McDaniel.

The sensing method described above is known in the art as the destructive charge readout that generates kTC noise. This is caused by equilibrating the node charge fermi level with the fermi level of the reference, which leaves some residual charge on the node. The fluctuations in the amount of residual charge generate kTC noise.

There is a well-known technique, used in the art, to minimize the undesirable effects of kTC noise called CDS (correlated double sampling) processing. An example of CDS application to CMOS image sensors is found in U.S. Pat. No. 6,133,862 to Dhuse. The key principle used in the CDS method consists of sampling the node twice. The first time without charge and the second time after charge has been transferred on the node. The difference of these two readings is the desired signal without kTC noise. Unfortunately this method is not 100% efficient in removing kTC noise, requires more complicated signal processing circuits including a memory for storing the first reading, and the double sampling increases Johnson noise. In many cases the CDS technique is not directly applicable to pixels of APS sensors, which gives the CMOS sensors a competitive disadvantage in comparison to CCD image sensors, where the more sophisticated signal processing is frequently used.

The charge readout that does not generate kTC noise is based on a complete charge removal from the node. This is used, for example, in Floating Gate charge detectors or Bulk Charge Detectors (U.S. Pat. No. 5,546,438 to Hynecek). Incorporating the structure with complete charge removal capability into the pixels of CMOS image sensors is one of the key points of the present invention.

SUMMARY OF THE INVENTION

The present invention relates to Active Pixel CMOS Image Sensors (APS) employing pixels that can be readout repeatedly and do not generate kTC noise. Such sensors have an advantage in efficient signal processing and subtracting the pixel signal response nonuniformities, since the inherent pixel temporal noise is very low and can be neglected. This leads to a superior low light level sensitivity and higher overall image sensing performance.

Incorporating the Vertical Punch Through (VPT) transistor into the CMOS sensor pixels, surrounding the source of the transistor by a junction gate that is connected to it, the junction gate being further completely surrounded by an MOS gate, achieves these and other objects of the invention.

The present invention to overcome limitations in prior art by providing practical non-destructive charge detection readout system for the pixels of typical CMOS image sensors that completely removes charge from the pixels during reset and therefore does not generate kTC noise. The invention also provides practical high performance charge detection CMOS sensor pixel design that is compatible with CMOS processing, has a non destructive charge readout, complete charge removal during reset, high sensitivity, high quantum efficiency, blooming protection, and low dark current.

BRIEF DESCRIPTION OF DRAWINGS

The invention will be described in detail in the following description of preferred embodiments with reference to the following figures wherein.

The process uses two levels of metal interconnects and two levels of polysilicon. The metal interconnects are shown only schematically to simplify the drawing.

DETAIL DESCRIPTION OF PREFERRED EMBODIMENTS

Figure 2:
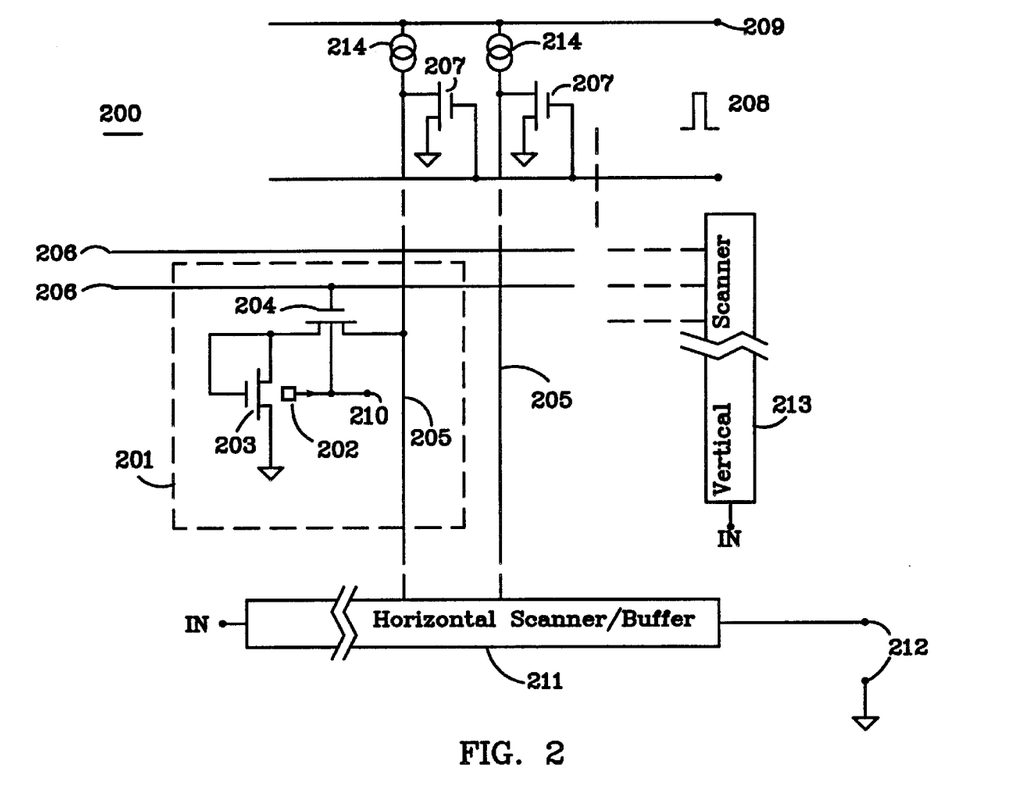
FIG. 2 is the schematic circuit diagram of the pixel of present invention that is incorporated into an array with scanning and addressing circuits shown in block diagram form, and showing the details of the column sense line biasing and reset circuits.

In FIG. 2, a circuit diagram of pixel 201 of the present invention is shown together with the block diagrams of peripheral circuits 211 and 213 of the image-sensing array 200. FIG. 2 shows column biasing and reset circuits that consist of current sources 214 and reset transistors 207. Pixel 201 consists of two transistors: the addressing transistor 204 and a special photo sensing Vertical Punch Through (VPT) transistor 203. The photo-sensing transistor includes the potential well 202 that accumulates photo-generated charge. Collected charge modulates the VPT transistor 203 threshold, which is the desired signal. Turning on the pixel-addressing transistor 204 and providing a small bias current to the pixel from the Vdd terminal 209 through the column biasing current source 214 senses the VPT transistor threshold. The pixel signal is transferred through the array column sense line 205 to horizontal scanning and buffering circuits 211, and further to the output sensor terminals 212. It is important to note that the column sense lines 205 serve a dual purpose. They transmit the pixel photo generated signal to the horizontal scanners as well as transmit the reset signal back to the pixels. The dual use of opaque metal lines results in higher sensor sensitivity and quantum efficiency. After the pixel sensing and readout are completed, the pixel is reset by momentarily turning on the reset transistor 207. This is accomplished by applying pulse 208 to its gate. All charge from the well 202 is completely removed to drain 210 and for this reason no kTC noise is generated. The pixel drain 210 may be conveniently formed by the CMOS n-well region that contains the addressing transistor 204, but it can also be formed by a standard n+ doped region. The array vertical addressing pulses are generated in the vertical scanner 213 and are supplied to the pixels through the addressing lines 206. The details of the scanner circuits, the signal buffering circuits, and current sources used in the array are well known in the art and will not be discussed here in any further detail, since they are not essential for the understanding of this invention. The addressing transistor 204 is a p-channel type in this embodiment of the invention, but n-channel transistors can equally be used here as is easily understood by those skilled in the art of the CMOS circuit design.

Figure 3:
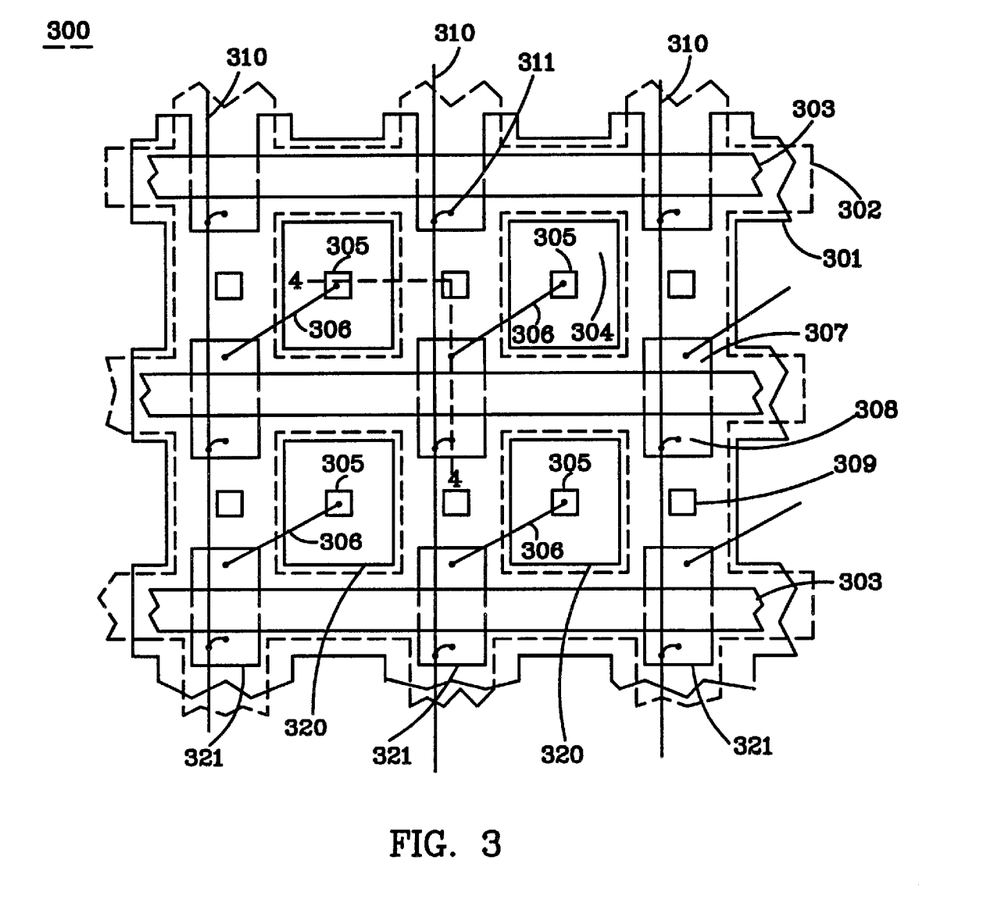
FIG. 3 is the layout of one possible embodiment of the present invention showing the 2×2 pixel sub array of the image sensor array whose fabrication process is compatible with CMOS technology.

The layout of one possible embodiment of the present invention is shown in FIG. 3. FIG. 3 shows a 2×2 pixel sub-array of the entire image-sensing array 300 where the metal layer interconnections are indicated only symbolically to keep the drawing uncluttered. The first polysilicon layer 301 is separated from the substrate by a suitable dielectric layer such as the silicon dioxide and covers the entire surface of the array. The polysilicon layer 301 has openings 320 where the special VPT photo-sensing transistors 203 (FIG. 2) are located as well as the openings 321 where the addressing transistors 204 are located. The p-type substrate has a diffused or implanted n-well 302 everywhere under the first polysilicon layer, but offset from it such that the polysilicon layer 301 always overlaps the n-well 302 by a predetermined fixed amount. The dielectric layer that separates the first polysilicon layer from the substrate has openings 309 that form the polysilicon to n-well contacts. A second polysilicon layer 303 overlays the first polysilicon layer 301 and is separated from it by a suitable dielectric such as silicon dioxide. The second polysilicon layer 303 forms the pixel addressing lines and the gates of the addressing transistors 204. The source regions 307 and the drain regions 308 of the addressing transistors 204 are doped with p+ type doping. The regions 307 are connected to the source of the VPT transistors 305 through the first metal interconnect lines 306. The regions 308 are connected through the first metal interconnect lines 311 to the column sense lines 310 that are formed by the second metal. The VPT transistors 305 have p+ type doped junction gate regions 304 connected to their sources as an integral part of one contiguous p+ type region. The drains of the VPT transistors 305 are the chip substrate.

Figure 4:
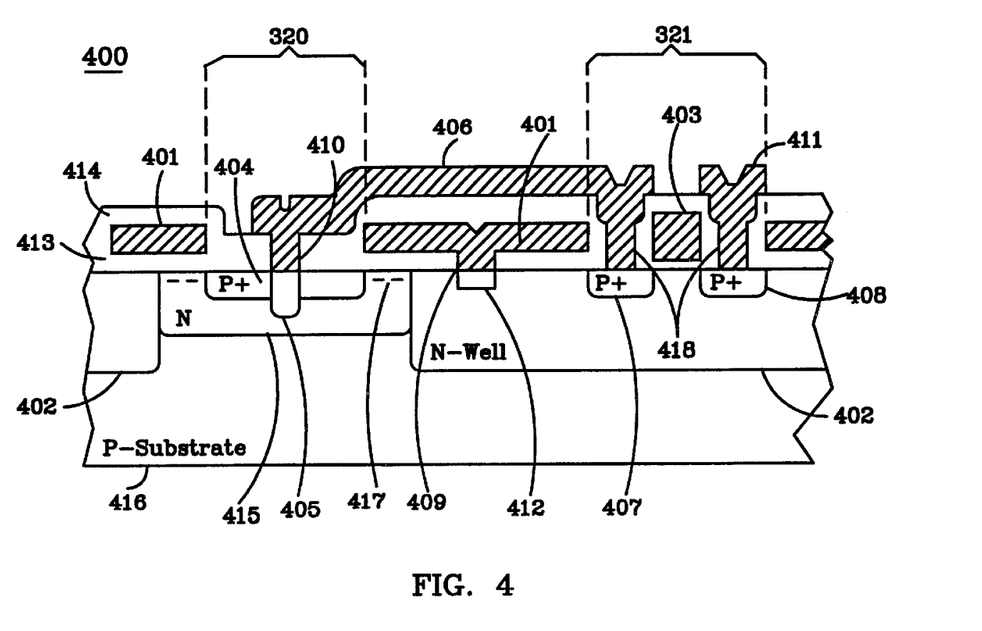
FIG. 4 is the cross section of one pixel of the present invention taken through the line 4—4 indicated in the drawing in FIG. 3, with the top device protective overcoat layers and some portions of the metal interconnecting layers omitted for simplification.

The cross section 400 of the pixel taken through the line 4—4 as indicated in FIG. 3 is shown in FIG. 4. FIG. 4 shows the p-type semiconductor substrate 416 that has CMOS n-well 402 located near its surface. Next to the n-well is the buried channel region 415 that covers the remaining surface regions that are not occupied by the n-well. The dielectric layer 413 covers the entire surface of the substrate except for the openings 409. The first n-type doped polysilicon layer 414 is deposited over the dielectric layer 413 and forms openings 320 and 321 as explained previously, with reference to FIG. 3. Polysilicon layer 414 makes contact with the substrate 416 through the openings 409 that allows a small mount of n-type doping to diffuse from the polysilicon into the n-well region 402, thus forming the n+ type doped n-well contact region 412. The opening 321 contains the p-channel addressing transistor 204 (FIG. 2) that is formed by the p+ type doped source region 407 and the p+ type doped drain region 408. The second n-type doped polysilicon layer 403 forms the gate of this transistor. The first metal interconnecting layer 406, 411 contacts the transistor p+ regions 407 and 408 through the contact holes 418. A suitable dielectric layer 414 separates the first metal interconnecting layers 406 and 411 from the first and second polysilicon layers 401 and 403. The photo-charge sensing VPT transistor 203 (FIG. 2) is formed in the opening 320. The transistor consists of p+ type doped source region 405 that is surrounded and connected to the p+ type doped first junction gate region 404. The drain of the VPT transistor is the substrate 416. The transistor further contains n-type doped buried channel region 415 that is overlapped by the first polysilicon layer 401, which forms the second MOS transistor gate. The overlap region contains the potential barrier adjustment implant 417. The metal interconnecting layer 406 contacts the VPT transistor source through the contact hole 410. In this embodiment the second MOS transistor gate is an integral part of the first polysilicon layer 401. However, it is obvious to those skilled in the art that a separate gate arrangement is also possible as will be shown later in another invention embodiment.

Figure 5:
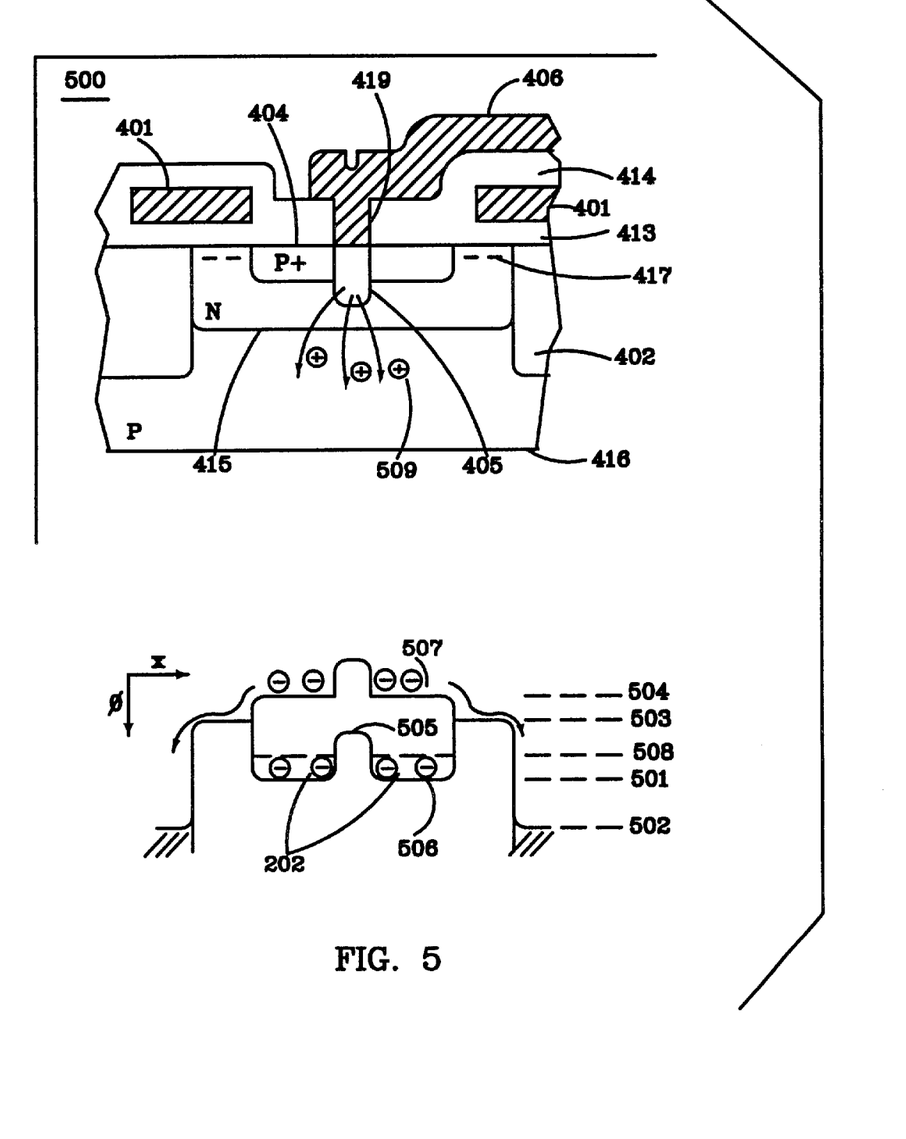
FIG. 5 shows the cross section and the potential profile diagrams of the pixel VPT transistor of the present invention for integration and rest time periods.

FIG. 5 shows in more detail the VPT transistor cross-section together with the corresponding potential profiles for two different biasing conditions. When the addressing transistor 204 (FIG. 2) is turned on, the VPT transistor punch through current of holes 509 starts to flow from the source 405 to substrate 416. During this cycle, the first junction gate 404 is biased at its high level 501. When charge 506 is present in the VPT transistor well 202 the bias level 501 changes to a new level 508. The change represents the signal. The presence of charge in the well modulates the punch through barrier 505, which in turn causes the level 501 to change to level 508. When sensing is completed, the reset transistor 207 is turned on and the bias of the junction gate 404 is lowered to its minimum level 504. This causes collected charge to flow over the barrier 503 to the drain that is biased at the level 502. The level 503 also serves as blooming protection. When too much charge is collected in the well, charge overflows the barrier 503 and flows into the drain. The drain is formed in this embodiment by the n-well 402. However, it is easily seen by those skilled in the art that other n+ type doped regions can be placed adjacent to the buried channel region 415 in place of the n-well region 402.

Figure 6:
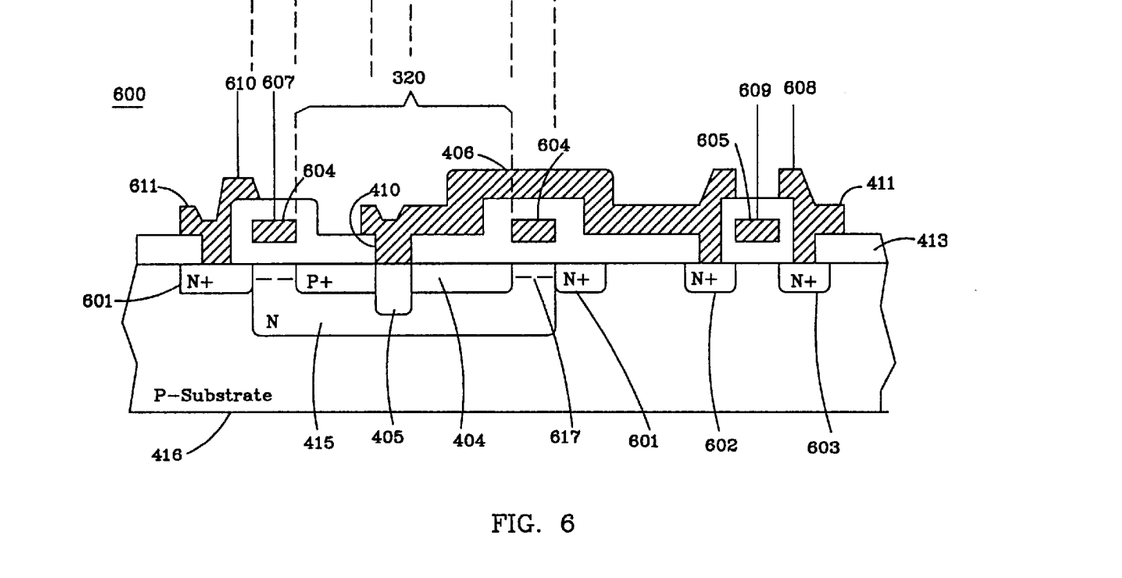
FIG. 6 shows the cross section of a pixel for another embodiment of the invention where the MOS gate that surrounds the P+ region of the cell is not connected to the n-well and is provided with a separate bias terminal.

Another embodiment of the present invention is illustrated in FIG. 6. This embodiment provides a separate drain region and separate bias terminals for the reset gate and drain. Also, for completeness, instead of a p-channel addressing transistor, an n-channel addressing transistor is used. Similarly, as shown in FIG. 4, the photo charge sensing VPT transistor is formed in the opening 320. The n-well 402 has been eliminated, and the n+ region 601 now serves as a drain instead. The field plate gate region 401 has also been eliminated and only a single polysilicon layer forming the gates 605 and 604 is used. The gate 604 surrounds the opening 320 and is connected to the bias terminal 607. The n+ region 601, located near the surface of the substrate is provided with a metal contact region 611 and a bias terminal 610. The region 601 surrounds the MOS gate region 604 and the buried channel region 415 to which it is contiguous. Similarly, as the implant 417 in FIG. 4, an implant 617 can be placed under the MOS gate 604 into the substrate. The regions 602 and 603, with the MOS gate 605 connected to the terminal 609, form the n-channel addressing transistor. The addressing transistor, shown in the previous embodiment formed by the p+ regions 407 and 408 with the MOS gate 403, is p-channel. The signal from the cell is read out through the metal contact region 411 and the terminal 608, also similarly as in the previous embodiment.

The main advantages of the second embodiment are: no need for the n-well in the photocell area, the need for only a single polysilicon gate layer, and availability of separate bias terminals for the reset MOS gate 604 and drain 601. The separate bias terminal for the MOS gate allows for a pixel-external adjustment of the overflow barrier height 503, shown in FIG. 5. The disadvantage of the second embodiment is a larger cell size that is needed for maintaining an adequate separation of the regions 601 and 602.

The above-described embodiments of the present invention have several additional advantages. The first junction gate of the VPT transistor is formed in the bulk of the silicon away from the interface states. This reduces dark current by minimizing contributions from the interface states. Connecting the gate 404 with the source of the VPT transistor 405 provides positive feedback in the structure. This significantly increases the transistor charge conversion sensitivity. The absence of any other structure over the junction gate 404 increases the pixel sensitivity particularly in the blue and UV regions of the spectrum. The pixel can also be addressed and read out repeatedly without being reset.

Figure 6A:
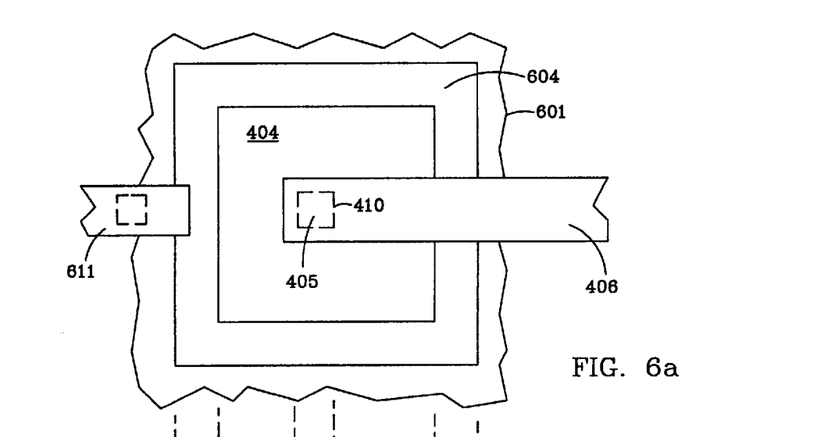
FIG. 6a is a top view of a portion of FIG. 6.

FIG. 6a is a top view of a portion of FIG. 6 showing MOS gate 604 which is above and surrounding junction gate 404. Also shown is source region 405, metal connecting layer 406, n+ region 601 and metal contact region 611. By view both FIG. 6 and FIG. 6a, the spacial relationship and the interconnection of the various elements of the CMOS active pixel sensor which includes a vertical punch through transistor.

Having described preferred embodiments of the novel CMOS image sensor whose pixels incorporate vertical punch through transistors, are reset through the column sense lines, have high sensitivity, high quantum efficiency, blooming protection, low dark current and no kTC noise, which are intended to be illustrative and not limiting, it is noted that modifications and variations can be made by persons skilled in the art in light of the above teachings. It is therefore to be understood that changes may be made in the particular embodiments of the invention disclosed which are within the scope and spirit of the invention as defined by the appended claims.

What is claimed:

1. A CMOS Active Pixel Sensor having pixels with complete charge removal during pixel reset, comprising:
   an array of CMOS sensor pixels on a substrate, said substrate having a surface; and
   a vertical punch through transistor, having a source near the surface of the substrate, incorporated into the array of CMOS sensor pixels.

2. The sensor according to claim 1, wherein at least one pixel of the array consists of an addressing transistor and a vertical punch through transistor.

3. The sensor according to claim 1, wherein the source of the said vertical punch through transistor is located substantially near the surface of the semiconductor substrate of the sensor array, and is connected to a first junction gate region surrounding the source and doped by the same impurity type as the source and as the substrate.

4. The sensor according to claim 3, wherein the first junction gate region has an underlying buried layer of opposite polarity doping than the source and the substrate.

5. The sensor according to claim 3, wherein the said first junction gate region is surrounded by a second MOS gate region separated from the substrate by a dielectric layer.

6. The sensor according to claim 5, wherein said second MOS gate region is biased to form a potential barrier to prevent charge accumulated under the first junction gate from escaping into surrounding semiconductor regions when the first junction gate is biased at a high bias level.

7. The sensor according to claim 6, wherein said potential barrier is positioned to allow charge accumulated under the first junction gate to escape into the surrounding semiconductor regions when the first junction gate is biased at a low bias level.

8. The sensor according to claim 5, wherein the second MOS gate region contains an n-type buried layer placed in a p type silicon substrate that is extending and contiguous with a n-type layer located under the first junction gate; and
   the second MOS gate region contains a threshold adjusting implant located in the substrate near a silicon-silicon dioxide interface.

9. The sensor according to claim 8, wherein a substrate region surrounding the MOS gate region includes n+ drain adjacent and contiguous with a buried channel region, said buried channel region being located in the substrate under the MOS gate, the said n+ drain region being further surrounded by a p-type substrate.

10. The Sensor according to claim 9, including a cell-addressing transistor placed in the p-type substrate.

11. The Sensor according to claim 10, where the vrll-addressing transistor is n-channel.

12. The sensor according to claim 6, wherein the semiconductor region in the substrate surrounding the second MOS gate region is n-well.

13. The sensor according to claim 12, wherein the said n-well contains at least one p-channel transistor.

14. The sensor according to claim 13, the sensor being formed on a semiconductor substrate, and wherein the n-well that is located in the semiconductor substrate which is overlapped by a polysilicon layer everywhere except for the regions that contain the p type transistors; and the polysilicon layer is isolated from the substrate by a suitable dielectric layer except for small openings that connect the polysilicon layer to the substrate and the n-well.

15. A CMOS Active Pixel Sensor having pixels with complete charge removal during pixel reset, comprising:

an array of CMOS sensor pixels on a substrate, said substrate having a surface;

a vertical punch through transistor, having a source near the surface of the substrate, incorporated into the array of CMOS sensor pixels;

a junction gate surrounding the source of the transistor; and an MOS gate surrounding the junction gate and separated from the substrate by a dielectric layer.

16. A CMOS Active Pixel Sensor having pixels with complete charge removal during pixel reset, comprising:

an array of CMOS sensor pixels on a substrate, said substrate having a surface;

a vertical punch through transistor, having a source near the surface of the substrate, incorporated into the array of CMOS sensor pixels; and peripheral CMOS circuits for addressing the pixels and read-out of the signals.

* * * * *